US011605876B1

(12) United States Patent
Li

(10) Patent No.: US 11,605,876 B1
(45) Date of Patent: Mar. 14, 2023

(54) BLUETOOTH ELECTRONIC TAG

(71) Applicant: Bing Xuan Li, Hsinchu (TW)

(72) Inventor: Bing Xuan Li, Hsinchu (TW)

( * ) Notice: Subject to any disclaimer, the term of this patent is extended or adjusted under 35 U.S.C. 154(b) by 0 days.

(21) Appl. No.: 17/893,410

(22) Filed: Aug. 23, 2022

(30) Foreign Application Priority Data

Jun. 23, 2022 (CN) .......................... 202210724202.5

(51) Int. Cl.
*H01Q 1/22* (2006.01)
*G06K 19/07* (2006.01)
*H05K 1/02* (2006.01)

(52) U.S. Cl.
CPC ....... *H01Q 1/2225* (2013.01); *G06K 19/0723* (2013.01); *H05K 1/0243* (2013.01); *H05K 2201/10098* (2013.01)

(58) Field of Classification Search
CPC ............. H01Q 1/2225; G06K 19/0723; H05K 1/0243; H05K 2201/10098
USPC ........................................ 455/41.2
See application file for complete search history.

(56) References Cited

U.S. PATENT DOCUMENTS

| 2018/0010329 | A1* | 1/2018 | Golding, Jr. | .............. B32B 5/26 |
| 2018/0317875 | A1* | 11/2018 | Khayrullaev | ........ A61B 5/7221 |
| 2019/0113632 | A1* | 4/2019 | Lucrecio | ............... G01S 5/0036 |
| 2019/0354734 | A1* | 11/2019 | Forster | ............... G06K 19/0723 |

* cited by examiner

*Primary Examiner* — Eugene Yun
(74) *Attorney, Agent, or Firm* — Hemisphere Law, PLLC; Zhigang Ma

(57) ABSTRACT

A BLUETOOTH electronic tag is provided, including an upper cover and a substrate, a circuit board is disposed on the substrate, and an electronic tag control circuit is disposed on the circuit board; the electronic tag control circuit includes a power circuit, a power protection circuit, a main control circuit, a BLUETOOTH transmission circuit, an identification circuit, and an electronic tag circuit; the power circuit is configured to provide power to the main control circuit through the power protection circuit; the main control circuit is configured to control the identification circuit through the BLUETOOTH transmission circuit, and the identification circuit is configured to transmit identification information to the electronic tag circuit. The BLUETOOTH electronic tag has complete functions, a stable and unimpeded information transmission, a convenient usage, and a good practicability, which improves a work efficiency.

9 Claims, 3 Drawing Sheets

BLUETOOTH ELECTRONIC TAG

TECHNICAL FIELD

The disclosure relates to a technical field of electronic radio frequency tags, in particular to a BLUETOOTH electronic tag.

BACKGROUND

At present, a radio frequency identification (RFID) technology uses electromagnetic fields to transmit data wirelessly. One of the main usages of the RFID technology is to automatically identify and track objects through RFID tags, and the RFID tags can be attached or merged into various objects, such as credit cards, passports, license plates, ID cards, mobile devices, etc. The RFID technology can also be applied in many fields, including but not limited to electronic charge, parking charge, border control, payment processing, asset management and transportation. Therefore, for example, license plates including the RFID tags can be used for electronic toll collection (ETC), electronic vehicle registration (EVR), transit and other purposes.

With a popularity of the Internet, a rise of electronic commerce, especially a rapid development of the Internet, business requirements of express deliveries are increasing day by day, and people are more eager for an efficient and reliable logistics tracking and positioning system. Electronic tags are commonly used in an inventory tracking and management of warehouses and large supermarkets. A main application scenario is an indoor environment, while an existing environment of logistics products may be indoors or outdoors with a sorting and distribution. Information transmission means of traditional electronic tags are single, and the information transmission is often blocked, resulting in the usages of the traditional electronic tags are very inconvenient, at the same time, resulting in a low work efficiency.

Chinese patent application No.: 201110328308.5, application date: Nov. 25, 2011, publication date: Feb. 22, 2012, patent name: an RFID electronic tag packaging method and RFID electronic tag. The patent provides an RFID electronic tag packaging method and RFID electronic tag, an antenna is attached to the inlay on a lower layer of coated paper of the electronic tag, and adhesive paper is attached to a gasket; extending the antenna to all entities of the tag, and cutting other places where the inlay has no antenna; pasting the RFID electronic tag on a commodity packaging port; the patent changes a traditional antenna design method, increases a possibility of tearing the electronic tag, and makes the RFID electronic tag avoid interference of metal and water. The patent can reduce packaging costs and improve an application range of commodities, ensure that each commodity can damage the RFID electronic tag when opening a packaging of the commodity, and avoid influences of a metal packaging and water on the RFID electronic tag.

The above patent document provides an RFID electronic tag, but the RFID electronic tag has insufficient functions, a blocked information transmission, a weak practicability and a low work efficiency. The tag can only store single data, which cannot meet needs of social developments.

SUMMARY

A main purpose of the disclosure is to provide a BLUETOOTH electronic tag with complete functions, a stable and unimpeded information transmission, a convenient usage, and a good practicability, which improves a work efficiency.

To achieve the above purpose, the disclosure provides the BLUETOOTH electronic tag, including an upper cover and a substrate, a circuit board is disposed on the substrate, and an electronic tag control circuit is disposed on the circuit board; the electronic tag control circuit includes a power circuit, a power protection circuit, a main control circuit, a BLUETOOTH transmission circuit, an identification circuit, and an electronic tag circuit;

the power circuit is configured to provide power to the main control circuit through the power protection circuit; the main control circuit is configured to control the identification circuit through the BLUETOOTH transmission circuit, and the identification circuit is configured to transmit identification information to the electronic tag circuit.

In an embodiment, the power circuit includes a power manager, and the power manger is configured to charge the power circuit.

In an embodiment, the main control circuit includes a wireless communication circuit, and the main control circuit is configured to control the identification circuit through the wireless communication circuit.

In an embodiment, the wireless communication circuit includes an antenna.

In an embodiment, the main control circuit includes an universal serial bus (USB) interface.

In an embodiment, the main control circuit includes a memory.

The technical scheme provided by the disclosure has following beneficial effects: 1) the electronic tag of the disclosure transmits information through the BLUETOOTH transmission circuit controlled by the main control circuit, the main control circuit identifies and uses the information through the electronic tag circuit controlled by the identification circuit; the disclosure can select multiple identification information, and ensure an unimpeded information transmission and a convenient usage; 2) the disclosure has various functions, which makes the identification information more accurate and the work efficiency higher. The disclosure transmits through the wireless communication circuit, which greatly enhances the function of the system and meets the different needs of the market; 3) the disclosure has a high intelligence, through increasing multiple applications, greatly reducing labor costs, and is suitable for a general promotion.

BRIEF DESCRIPTION OF DRAWINGS

In order to more clearly explain the embodiments of the disclosure or the technical schemes in the prior art, the following will briefly introduce the drawings that need to be used in the description of the embodiments or the prior art. It is obvious that the drawings in the following description are only some embodiments of the disclosure. For those skilled in the art, other drawings can be obtained according to the structure shown in these drawings without paying creative work.

Figure 1:
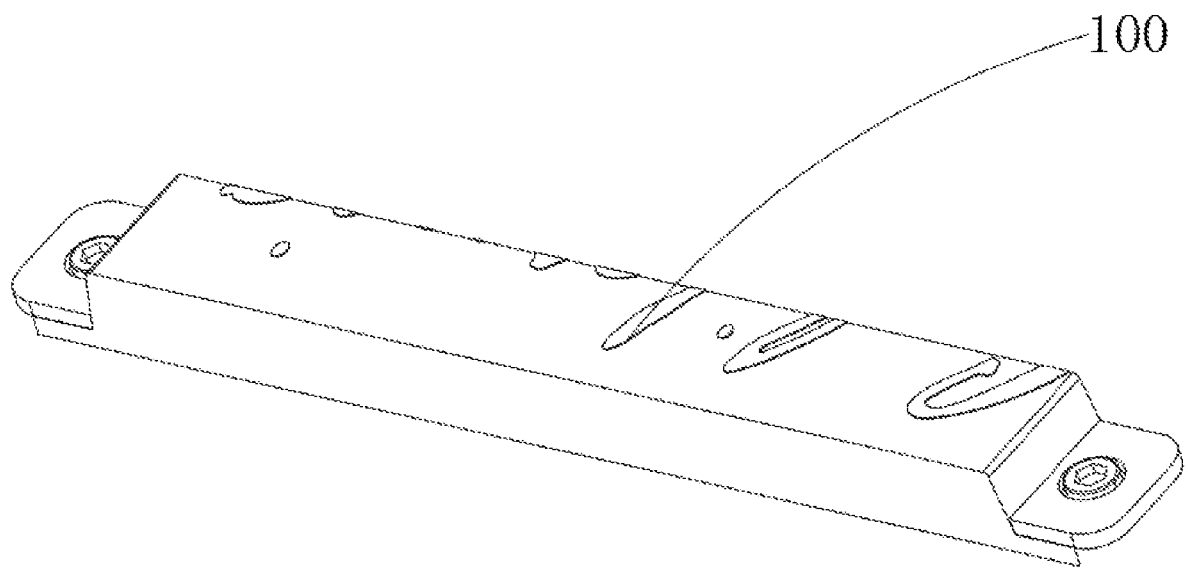
FIG. 1 is a schematic structural diagram of a BLUETOOTH electronic tag of the disclosure.
Figure 2:
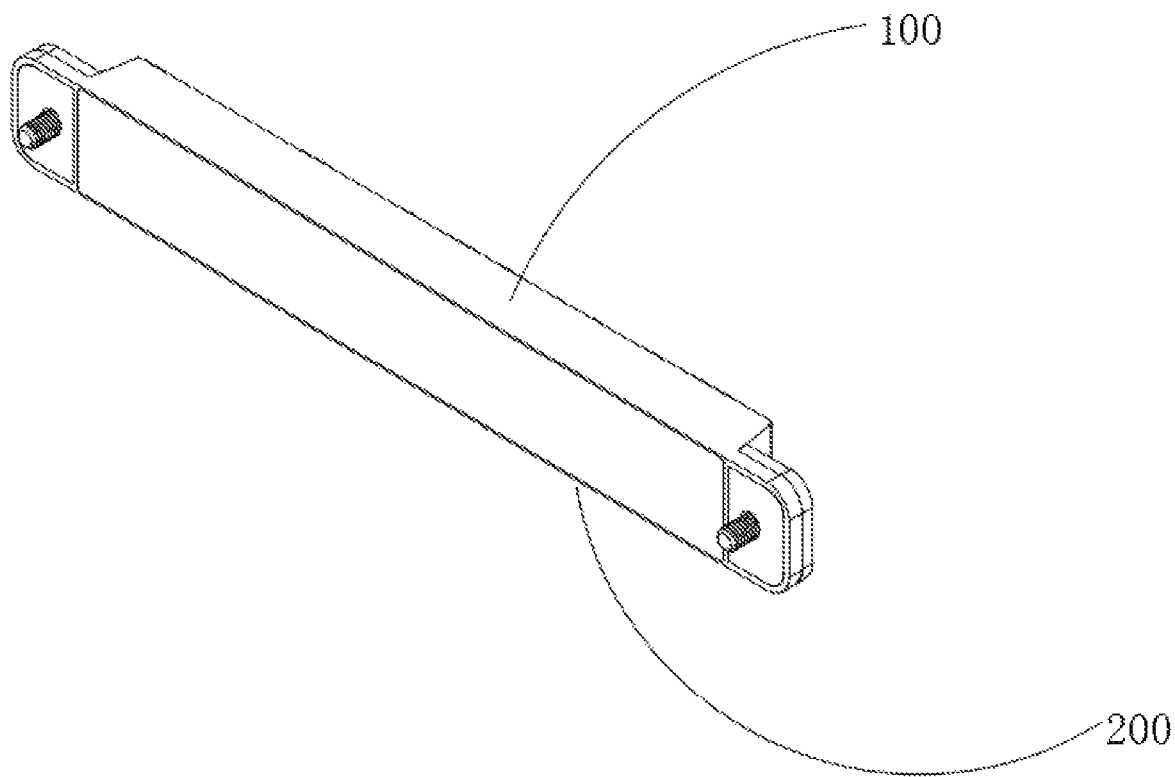
FIG. 2 is another schematic structural diagram of the BLUETOOTH electronic tag of the disclosure.

A realization of purposes, functional characteristics and advantages of the disclosure will be further described with reference to the attached drawings in combination with some embodiments.

DETAILED DESCRIPTION OF EMBODIMENTS

The technical schemes in the embodiments of the disclosure will be clearly and completely described below in combination with the drawings in the embodiments of the disclosure. Obviously, the described embodiments are only part of the embodiments of the disclosure, not all of them. Based on the embodiments in the disclosure, all other embodiments obtained by those skilled in the art without creative work should be within the scope of the disclosure.

It should be noted that all directional indications (such as up, down, left, right, front, rear . . . ) in the embodiment of the disclosure are only used to explain the relative position relationship and motion among components in a specific position (as shown in the attached figures). If the specific position changes, the directional indications will also change accordingly.

In the disclosure, unless specific provisions and limitations, the terms "connect", "fix" and etc., should be understood in a broad sense. For example, "fix" can be a fixed connection, a detachable connection, or integrated into one; it can be a mechanical connection or an electrical connection; it can be directly connected or indirectly connected through an intermediate medium. It can be the connection within two elements or the interactive relationship between two elements, unless the specific provisions and limitations, for those skilled in the art, the specific meaning of the above terms in the disclosure can be understood according to the specific situation.

In addition, the description of "first", "second" and etc., in the disclosure is only for descriptive purposes, and cannot be understood as indicating or implying its relative importance or implicitly indicating the number of indicated technical characteristics. Thus, the characteristics defined with "first" and "second" may explicitly or implicitly include at least one of the characteristics. In addition, the technical schemes between various embodiments can be combined with each other, but it must be based on the realization of those skilled in the art. When the combination of technical schemes is contradictory or impossible, it should be considered that the combination of technical schemes does not exist and is not within the protection scope of the disclosure.

The disclosure provides a BLUETOOTH electronic tag.

Embodiment 1

Referring to FIG. 1, FIG. 2, FIG. 3, and FIG. 4, in an embodiment of the disclosure, the BLUETOOTH electronic tag, including an upper cover 100 and a substrate 200, a circuit board 400 is disposed on the substrate 200, and an electronic tag control circuit is disposed on the circuit board 400; the electronic tag control circuit includes a power circuit 10, a power protection circuit 20, a main control circuit 30, a BLUETOOTH transmission circuit 40, an identification circuit 50, and an electronic tag circuit 60;

the power circuit 10 provides power to the main control circuit 30 through the power protection circuit 20; the main control circuit 30 controls the identification circuit 50 through the BLUETOOTH transmission circuit 40, and the identification circuit 50 transmits the identification information to the electronic tag circuit 60.

In the embodiment, the identification circuit 50 includes a RFID tag chip, for example, a model of the RFID tag chip is Monza® X-8K Dura.

In the embodiment, the electronic tag circuit 60 includes a RFID IC containing an antenna transmitting circuit, a model of the RFID IC is ALC-360 series, for example, ALC-360-CW07J supplied by Alien Technology Corporation.

In the embodiment, the power circuit 10 includes a low-dropout voltage regulator, for example, a model of the low-dropout voltage regulator is TPS7A05.

In the embodiment, the power protection circuit 20 includes a transient voltage suppression (TVS) diode and a Schottky barrier diode, for example, a model of the TVS diode is SD24C and a model of the Schottky barrier diode is 1N5819HW-7-F.

In the embodiment, the BLUETOOTH transmission circuit 40 includes a BLUETOOTH chip, for example, a model of the BLUETOOTH chip is RTL8762C.

Figure 3:
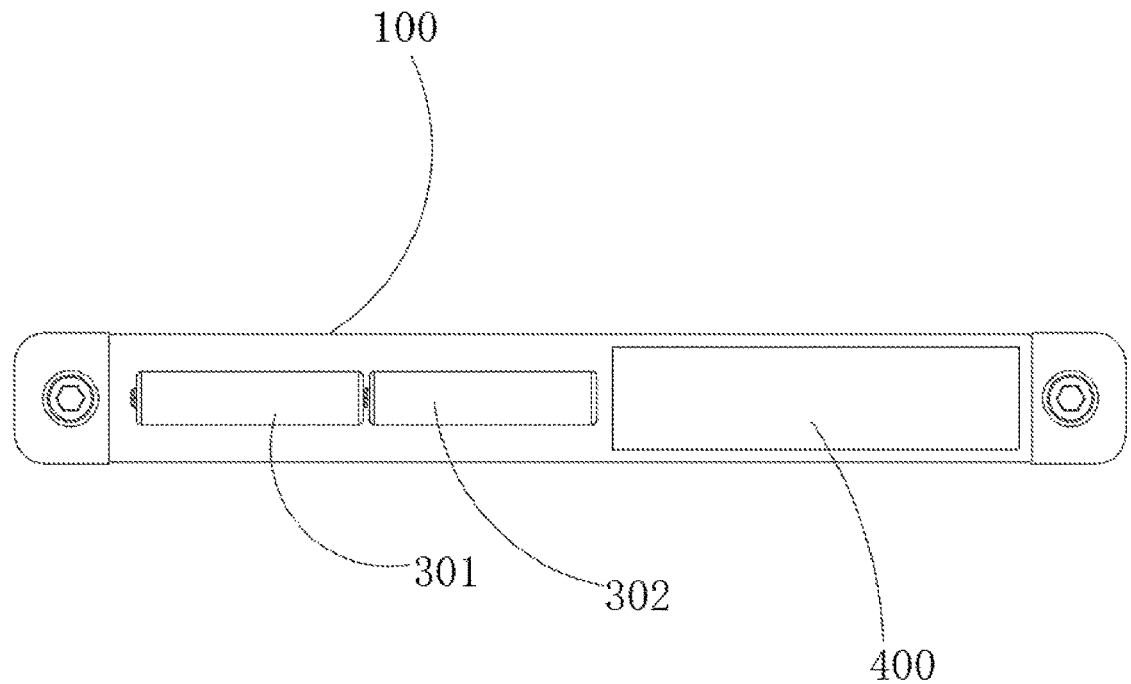
FIG. 3 is a schematic internal structural diagram of the BLUETOOTH electronic tag of the disclosure.
Figure 4:
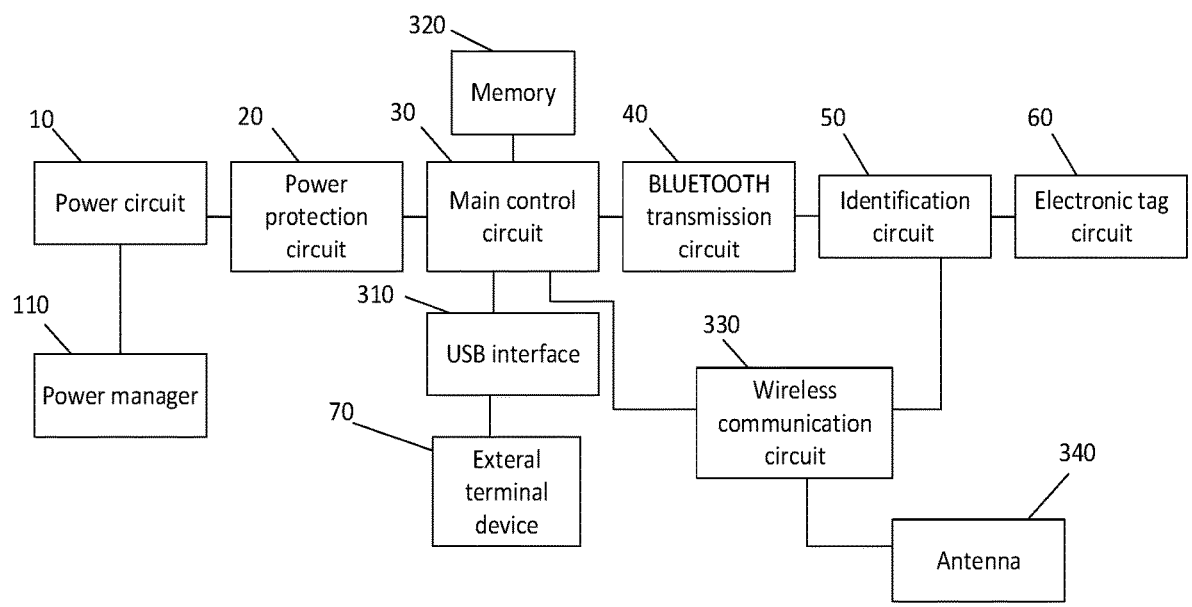
FIG. 4 is a schematic block diagram of an electronic tag control circuit of the BLUETOOTH electronic tag of the disclosure.

In the embodiment, the power circuit 10 includes batteries, please refer to the FIG. 3, the batteries include a first alkaline battery 301 and a second alkaline battery 302, and the first alkaline battery 301 is connected in series with the second alkaline battery 302; the power protection circuit 20 protects the power circuit 10 from breakdown which results in a power supply interruption.

In the embodiment, the main control circuit 30 is configured to analyze and process information, after the main control circuit 30 analyzes and processes the information, through the BLUETOOTH transmission circuit 40 transmits the information to the identification circuit 50, the identification circuit 50 identifies the processed information of the main control circuit 30, then the identification circuit 50 transmits the identified information to the electronic tag circuit 60.

In the embodiment, the main control circuit 30 includes a micro-controller unit (MCU) (also referred to as a single chip microcomputer), and a model of the MCU may be MC68HC705B32 or FS32K144H.

In the embodiment, the power circuit 10 includes a power manager 110, and the power manger 110 charges the power circuit 10.

The power manger 110 charges the power circuit 10 can ensure the disclosure can work for a long time and improve the work efficiency.

In the embodiment, the main control circuit 30 includes a wireless communication circuit 330, and the main control circuit 30 controls the identification circuit 50 through the wireless communication circuit 330.

In the embodiment, the wireless communication circuit 330 includes a 4th generation mobile communication technology (4G) wireless communication module or a 5th generation mobile communication technology (5G) wireless communication module; the main control circuit 30 transmits the analyzed and processed information to the identification circuit 50 through the wireless communication circuit 330, which further ensures the unimpeded information transmission and improves a work efficiency.

In the embodiment, the wireless communication circuit 330 includes an antenna 340. The antenna 340 ensures the wireless communication circuit 330 to transmit the information with higher intensity and better quality, and further ensures that the main control circuit 30 can transmit the processed information to the identification circuit 50 more smoothly, making the usage of the disclosure more convenient and flexible.

In the embodiment, the main control circuit 30 includes an universal serial bus (USB) interface 310. The main control circuit 30 transmits the information to an external terminal device 70 through the USB interface 310. The terminal device 70 includes a personal computer (PC) terminal or a terminal device such as a smart mobile or a tablet computer. The external terminal device 70 also includes an asynchronous universal transceiver, and the USB interface 310 transmits or receives the information to the external terminal device 70 through the asynchronous universal transceiver.

In the embodiment, the main control circuit 30 includes a memory 320. The main control circuit 30 stores the analyzed and processed information in the memory 320, and make the usage of the disclosure more convenient and flexible.

The memory 320 includes multiple identification information, the terminal device includes the smart mobile or the PC terminal, the main control circuit 30 can select the multiple identification information and identify the processed information through the memory 320, selecting correct identification information, and transmitting the identification information to the electronic tag circuit 60 finally.

Example 1: a driver in a car can select specific identification information and repeatedly update the information of the electronic tag through the mobile phone and instructions under an authentication of the disclosure to reflect an actual situation of the number of passengers in the car, so as to get the highway fee discount.

Example 2: a driver in a car can select specific identification information through the mobile phone and the instructions under the certification of the disclosure, and repeatedly update the information of the electronic tag to select the car is self-use, commercial or military, which can correctly correspond to the highway fee.

Embodiment 2

Figure 5:
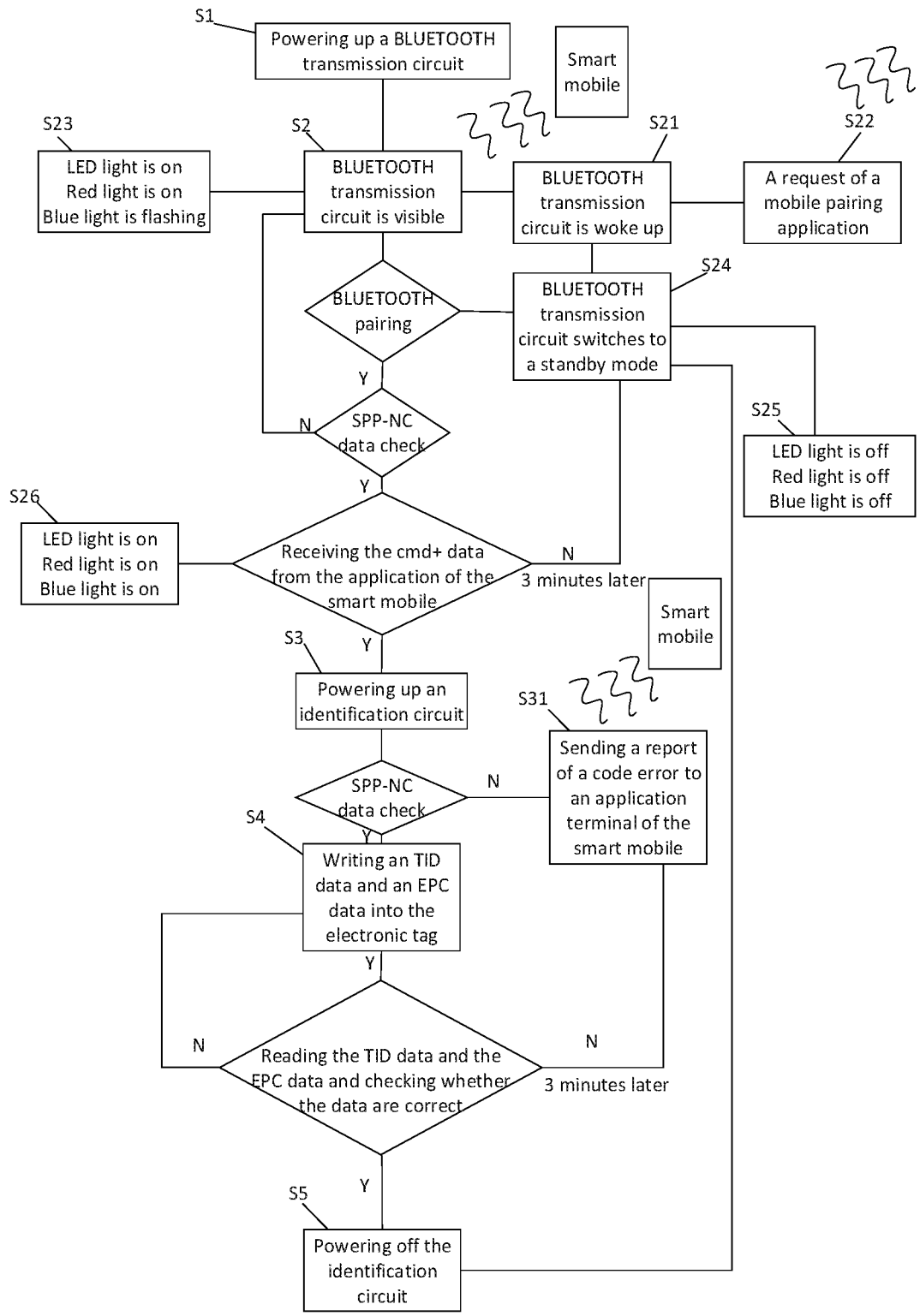
FIG. 5 is a schematic flowchart of the BLUETOOTH electronic tag of the disclosure.

Referring to FIG. 5, in the embodiment, operations of the disclosure include following steps.

Step S1, powering up a BLUETOOTH transmission circuit 40.

Step S2, the BLUETOOTH transmission circuit 40 is visible, the BLUETOOTH transmission circuit 40 can pair with a BLUETOOTH of a smart mobile; after the BLUETOOTH is paired, service switching point to network connection (SSP-NC) data can be checked; the BLUETOOTH transmission circuit 40 can receive a command (cmd+) data sent by an application of the smart mobile after the SSP-NC data checked is qualified; and then step S3 is carried out.

Step S3, powering up an identification circuit 50.

Step S4, writing a terminal identification (TID) data and an electronic product code (EPC) data into the identification circuit 50; reading the TID data and the EPC data and checking whether the datas are correct.

Step S5, after the above operations, powering off the identification circuit 50.

In the embodiment, the disclosure includes an indicator light, the indicator light includes a light emitting diode (LED) light, a red light, and a blue light; the step S2 includes step S23, when the BLUETOOTH transmission circuit is visible, the LED light is on, the red light is on and the blue light is flashing.

In the embodiment, in the step S2, when the BLUETOOTH transmission circuit is visible, step S21 can be carried out to wake up the BLUETOOTH transmission circuit; then carrying out step S22 to receive a request of a phone pairing application.

In the embodiment, in the step S21, the BLUETOOTH transmission circuit is woke up to carry out next step, in the step S24, the BLUETOOTH transmission circuit switches to a standby mode; at the moment, in the step S25, the LED light is off, the red light is off, and the blue light is off.

In the embodiment, in above steps, after receiving the cmd+ data successfully from the application of the smart mobile, step S26 is carried out, the LED light is on, the red light is on and the blue light is on.

The disclosure has a good practicability, can store multiple identification information, has a stable information transmission and diverse functions. The disclosure meets needs of developments of electronic tags in modern society, and is also a technical upgrade of a technical field of the electronic tags.

The above are only some embodiments of the disclosure, which does not limit a scope of the patent of the disclosure. Without departing from the spirit and scope of the disclosure, the disclosure will also have various changes and improvements. Under the disclosure concept of the disclosure, the equivalent structural transformation made by using the description and attached drawings of the disclosure, directly or indirectly applied in other relevant technical fields, are included in the scope of patent protection of the disclosure.

What is claimed is:

1. A BLUETOOTH electronic tag, comprising: an upper cover and a substrate, wherein a circuit board is disposed on the substrate, and an electronic tag control circuit is disposed on the circuit board; the electronic tag control circuit comprises a power circuit, a power protection circuit, a main control circuit, a BLUETOOTH transmission circuit, an identification circuit, and an electronic tag circuit;
   wherein the power circuit is configured to provide power to the main control circuit through the power protection circuit; the main control circuit is configured to control the identification circuit through the BLUETOOTH transmission circuit, and the identification circuit is configured to transmit identification information to the electronic tag circuit;
   wherein the upper cover and the substrate form a closed cavity, and the power circuit comprises a battery disposed in the closed cavity; and the main control circuit comprises a single chip microcomputer and a memory stored with a plurality of identification information, the single chip microcomputer is configured to select target identification information from the plurality of identification information stored in the memory, and transmit the target identification information to the identification circuit through the BLUETOOTH transmission circuit, and the identification circuit is configured to transmit the target identification information to the electronic tag circuit.

2. The BLUETOOTH electronic tag according to claim 1, wherein the power circuit comprises a power manager, and the power manger is configured to charge the power circuit.

3. The BLUETOOTH electronic tag according to claim 2, wherein the main control circuit comprises a wireless communication circuit, and the main control circuit is configured to control the identification circuit through the wireless communication circuit.

4. The BLUETOOTH electronic tag according to claim 3, wherein the wireless communication circuit comprises an antenna.

5. The BLUETOOTH electronic tag according to claim 4, wherein the main control circuit comprises an universal serial bus (USB) interface.

6. The BLUETOOTH electronic tag according to claim 1, wherein the power circuit comprises: a low-dropout voltage regulator, the power protection circuit comprises: a transient voltage suppression (TVS) diode and a Schottky barrier diode, the main control circuit comprises: a single chip microcomputer, the BLUETOOTH transmission circuit comprises a BLUETOOTH chip, the identification circuit comprises a radio frequency identification (RFID) tag chip, and the electronic tag circuit comprises a RFID integrated circuit (IC) containing an antenna transmitting circuit.

7. The BLUETOOTH electronic tag according to claim 1, wherein the BLUETOOTH transmission circuit is further configured to receive command data from a terminal device before writing a TID data and an EPC data into the identification circuit, and after writing the TID data and the EPC data into the identification circuit, the TID data and the EPC data are read for checking whether the TID data and the EPC data are correct.

8. A BLUETOOTH electronic tag, comprising:
an upper cover and a substrate; wherein the upper cover and the substrate form a closed cavity;
a circuit board, disposed on the substrate;
an electronic tag control circuit, disposed on the substrate;
wherein the electronic tag control circuit comprises:
a single chip microcomputer;
a BLUETOOTH chip, connected to the single chip microcomputer;
a RFID tag chip, connected to the BLUETOOTH chip;
a RFID IC containing an antenna transmitting circuit, connected to the RFID tag chip;
a memory, connected to the single chip microcomputer and stored with a plurality of identification information; and
a battery, connected to the single chip microcomputer, and disposed in the closed cavity;
wherein the single chip microcomputer is configured to select target identification information from the plurality of identification information stored in the memory, and transmit the target identification information to the RFID tag chip through the BLUETOOTH chip, and the RFID tag chip is configured to transmit the target identification information to the RFID IC.

9. The BLUETOOTH electronic tag according to claim 8, wherein the BLUETOOTH chip is further configured to receive command data from a terminal device before writing a TID data and an EPC data into the RFID tag chip, and after writing the TID data and the EPC data into the RFID tag chip, the TID data and the EPC data are read for checking whether the TID data and the EPC data are correct.

\* \* \* \* \*